United States Patent [19]
McLaury

[11] Patent Number: 5,912,855
[45] Date of Patent: *Jun. 15, 1999

[54] POWER UP INITIALIZATION CIRCUIT RESPONDING TO AN INPUT SIGNAL

[75] Inventor: Loren L. McLaury, Boise, Id.

[73] Assignee: Micron Technology, Inc., Boise, Id.

[ * ] Notice: This patent is subject to a terminal disclaimer.

[21] Appl. No.: 08/915,845

[22] Filed: Aug. 21, 1997

Related U.S. Application Data

[63] Continuation of application No. 08/489,176, Jun. 9, 1995, Pat. No. 5,710,741, which is a continuation of application No. 08/209,658, Mar. 11, 1994, abandoned.

[51] Int. Cl.$^6$ ....................................................... G11C 13/00
[52] U.S. Cl. ........................... 365/226; 365/154; 365/193; 365/194; 365/222; 365/230.01; 365/230.08
[58] Field of Search .................................... 365/226, 154, 365/193, 194, 227, 230.01, 230.08, 222

[56] References Cited

U.S. PATENT DOCUMENTS

| | | | |
|---|---|---|---|
| 5,202,855 | 4/1993 | Morton | 365/226 |
| 5,301,161 | 4/1994 | Landgrad et al. | 365/226 X |
| 5,323,066 | 6/1994 | Fieddeler et al. | 365/226 X |
| 5,325,330 | 6/1994 | Morgan | 365/189.05 |
| 5,710,741 | 1/1998 | McLaury | 365/226 |

*Primary Examiner*—Do Hyun Yoo
*Attorney, Agent, or Firm*—Schwegman, Lundberg, Woessner and Kluth P.A.

[57] ABSTRACT

A power up pulse generator circuit generates a pulse of predetermined duration in spite of a slow rate of change of applied power supply voltage. The circuit has application to integrated logic circuits that begin operation from an initial condition after the application of the power supply voltage and an input signal. In one embodiment, a dynamic random access memory (DRAM) of the present invention begins operation after receiving an address strobe signal. The address strobe signal is coupled to the power up pulse generator circuit to assure that the power up pulse is of sufficient duration to reset internal registers and so establish the initial condition. The power up pulse generator circuit of such an embodiment includes a selectively enabled input buffer, a selectively enabled one shot, and a flip flop designed to assume a predetermined state on application of the power supply voltage.

19 Claims, 6 Drawing Sheets

POWER UP INITIALIZATION CIRCUIT RESPONDING TO AN INPUT SIGNAL

This application is a continuation of U.S. patent application Ser. No. 08/489,176, filed Jun. 9, 1995 now U.S. Pat. No. 5,710,741, which is a continuation of U.S. patent application Ser. No. 08/209,658, filed Mar. 11, 1994 now abandoned.

FIELD OF THE INVENTION

This invention relates to integrated circuits for performing electrical functions beginning from an initial condition after the application of a power signal and an input signal.

BACKGROUND OF THE INVENTION

As one example of an integrated circuit (IC) that begins operation from an initial condition after the application of a power signal, consider a dynamic random access memory (DRAM) formed on a substrate. Such an IC conventionally accepts an externally applied power signal ($V_{CCX}$) on one of its contacts. To operate, $V_{CCX}$ is applied with a voltage in a range including 5 volts measured relative to a ground contact. For retaining data stored in the memory while it operates, $V_{CCX}$ is supplied from a battery in a range including 3.3 volts. Operation from an initial condition follows, for example, two different types of transitions: the transition from 0 volts to 5 volts for beginning operation of the DRAM, and the transition from 3.3 volts to 5 volts for resuming operation of a DRAM containing previously stored data.

Whether beginning with or without previously stored data, circuits within the DRAM may not correspond to the initial condition until after receiving an initialization signal. Conventional initialization signals include a pulse having a leading edge generated when a change in the applied power signal is detected, and a trailing edge generated when a predetermined time period has lapsed. The conventional timer circuit used for generation of the initialization signal does not operate properly when the voltage of the applied power signal changes too slowly.

Improper operation is most apparent when the timer circuit used to generate the initialization pulse includes a current source driven from $V_{CCX}$. The current source provides a regulated current for charging a capacitor of substantial capacitance. When the voltage developed on the capacitor exceeds a threshold, the trailing edge of the initialization pulse is generated. But, when the voltage of $V_{CCX}$ rises slowly over a considerable time, for example 6 milliseconds per volt, the voltage on the capacitor may exceed the threshold before $V_{CCX}$ is of sufficient magnitude to achieve reliable initialization.

Proper operation depends on reliable initialization, even when the applied $V_{CCX}$ signal cannot be generated with a sufficiently rapid transition to the operating level. When an integrated circuit such as a DRAM is not properly initialized, i.e. does not begin from a predetermined initial condition, inaccurate data may be recalled or new data may not be accurately stored. System failure is likely to result from use of such unreliably stored data.

Memory devices are commonly used in a wide variety of system designs, including computer, telecommunications, banking, video, and audio equipment, to name a few major applications. When system performance requires additional memory capability, such as proper operation in spite of slowly varying power supply voltage, it is desirable to deliver such additional capability without adversely affecting other aspects of the system design. In other words, it is desirable for improved memory to be compatible with existing system designs so that expensive redesign can be avoided.

In view of the problems described above and related problems that consequently become apparent to those skilled in the applicable arts, the need remains in integrated circuit technology for a power up initialization circuit that, among other capabilities, operates reliably when the applied power signal is characterized by a slow transition to an operating power level.

SUMMARY OF THE INVENTION

Accordingly, an integrated circuit (IC) in one embodiment of the present invention performs an electrical function beginning from an initial condition. The IC is responsive to a power signal and an input signal. The input signal is received after the power signal is received. The IC includes a signal generator and a subcircuit, each powered by the power signal.

The signal generator generates a first signal in response to the power signal and a second signal in response to the input signal. The subcircuit is coupled to the signal generator and performs the electrical function so that performance, in response to the second signal, is from the initial condition.

According to a first aspect of such an embodiment, performance of the electrical function is stayed after receipt of the first signal and performance begins from the initial condition after the second signal has been received. By generating the second signal in response to the input signal, proper initialization can be achieved because the signal generator is not responsive to the rate of change of transitions of the power signal.

According to another aspect, the first and second signals are generated by a flip flop so that the time between generation of the first signal and the generation of the second signal is less dependent on changes of the power signal voltage. That is to say that the power signal voltage is not used to measure time.

According to yet another aspect, the flip flop attains a state for generating the first signal by the application of the power signal voltage, without more. By generating the first signal as soon as the power signal is applied, more time is available for the process of staying performance of the IC's electrical functions and of resetting so that performance may begin immediately after receipt of the second signal.

In an alternate embodiment, a dynamic memory, of the present invention provides a data signal. The memory is powered by a power signal and is responsive to an address signal, an address strobe, and a first signal. The memory includes a conductor, i.e. a node, for conveying the address strobe and the first signal. In addition, the memory includes a timing circuit, an array of memory cells, and means for addressing.

The timing circuit is powered by the power signal and generates a second signal in response to the power signal. The timing circuit is coupled to the conductor and generates a third signal in response to the input signal.

The means for addressing is also powered by the power signal. This addressing means is operable from an initial condition in response to the third signal. The addressing means identifies a selected memory cell of the array in response to the address signal and the address strobe. The addressing means also provides the data signal responsive to data stored in the selected memory cell.

According to a first aspect of such a memory, the first signal and the address strobe are conveyed on the same conductor so that systems designed to provide several occurrences of the address strobe signal to a conventional memory are compatible with memory of the present invention. The first occurrence of an address strobe provided to a memory of the present invention, therefore, operates as the first signal.

According to another aspect of such a memory, the time between application of the power signal and receiving the first signal is conventionally accommodated by system design rules. By providing the second signal in response to the power signal and the third signal in response to the first signal, the time available for memory initialization depends on system design rules rather than on the transition time for attaining power supply voltage. As systems are expanded, transition times typically degrade by additional system power supply distribution and loading factors. Memory of the present invention when installed in a system subject to such expansion is less likely to be adversely affected by system expansion.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

In each functional block diagram, a broad arrow symbolically represents a group of signals that together signify a binary code. For example, a group of address lines is represented by a broad arrow because a binary address is signified by the signals taken together at an instant in time. A group of signals having no binary coded relationship is shown as a single line with an arrow. A single line between functional blocks represents one or more signals.

Signals that appear on several related figures and have the same mnemonic are directly or indirectly coupled together. A signal named with a mnemonic and a second signal named with the same mnemonic followed by an asterisk are related by logic inversion.

DESCRIPTION OF THE INVENTION

Figure 1:
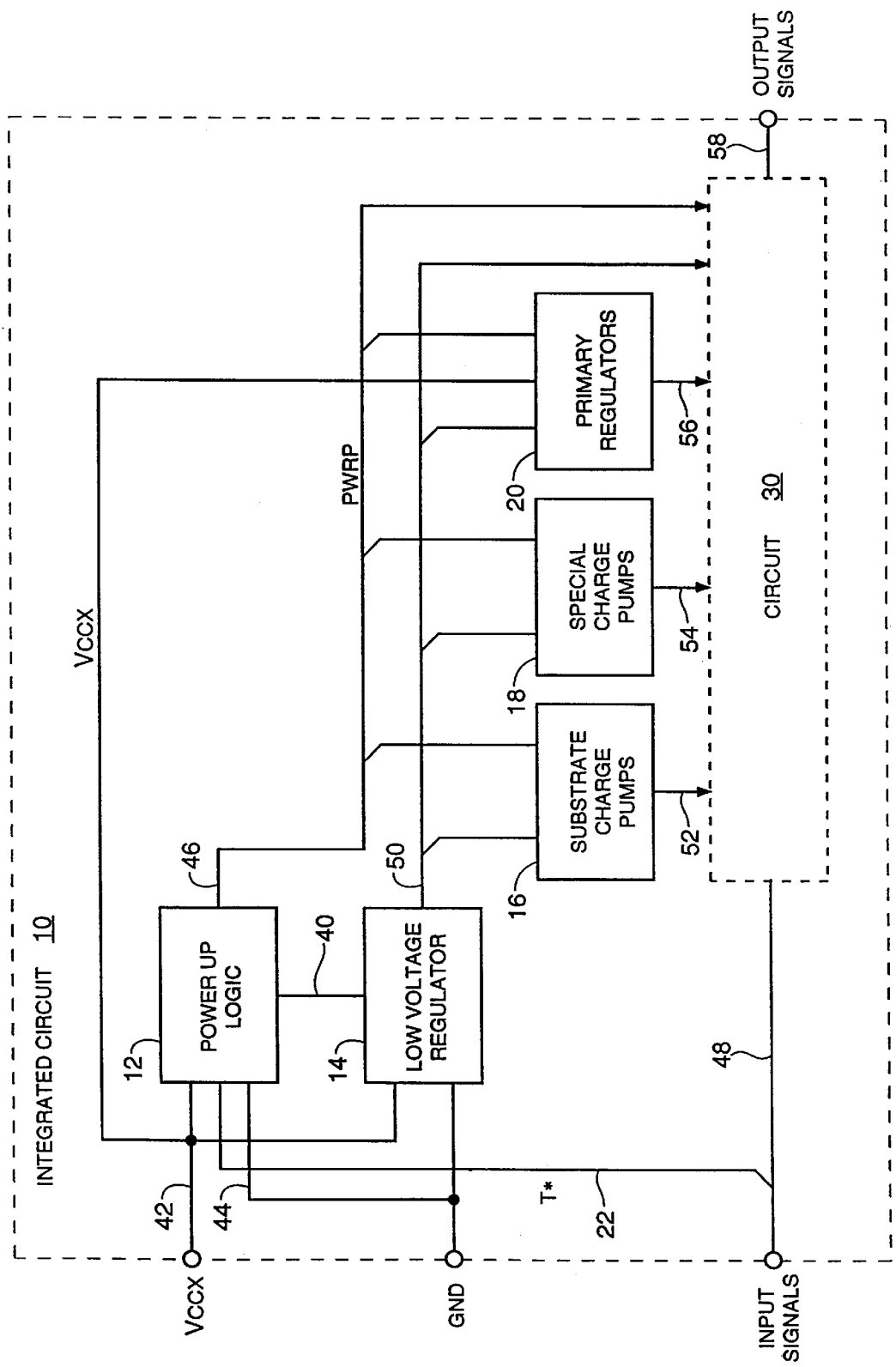
FIG. 1 is a functional block diagram of an integrated circuit of the present invention.

FIG. 1 is a functional block diagram of an integrated circuit (IC) of the present invention. IC 10 is an integrated circuit having conventional electrical circuit functions shown generally as circuit 30, and connections for power signals 42 ($V_{CCX}$), ground conductor 44 (GND), input signals 48 and output signals 58.

Input signal 22, conveyed with input signals 48, is coupled to power up logic 12. In an alternate and equivalent embodiment, input signal 22 is also coupled to circuit 30 so that it operates for initialization and for electrical functions performed by circuit 30. Input signal 22, also labeled T*, rises from logic low to logic high in cooperation with the application of power signal $V_{CCX}$. Since both signal T* and $V_{CCX}$ are provided by circuits external to IC 10, the performance of IC 10 is guaranteed only when the applied signals conform to voltage and timing specifications. These voltage and timing specifications are conventionally accommodated in system designs by so-called design rules. For example, in an embodiment wherein IC 10 includes a DRAM and signal T* is provided on a conductor common with row address strobe signal RAS* to be discussed with reference to FIG. 6, a transition of signal T* is not allowed until after $V_{CCX}$ has been applied for 100 microseconds. In addition, several transitions are conventionally required, for example 8, before read and write functions can be assured to operate properly.

Output signals 58 are not necessary and may be deleted when the function of circuit 30 does not require provision of an output signal. As shown, circuit 30 uses power and control signals for initialization and operation.

Power signals provided to circuit 30 are derived from power signals 42. Voltages of power signals, for example $V_{CCX}$, are conventionally measured relative to a reference signal, for example GND. When circuit 30 requires multiple power signals for operation, integrated circuit 10 includes low voltage regulator 14 and primary regulators 20. Low voltage regulator 14 provides intermediate power signals 50, coupled as required to substrate charge pumps 16, special charge pumps 18, and primary regulators 20. Substrate charge pumps 16 provide power signals 52 coupled to circuit 30. Special charge pumps 18 provide power signals 54 coupled to circuit 30. Primary regulators 20 provide power signals 56 coupled to circuit 30. When circuit 30 requires fewer power signals for operation, intermediate power signals 50 may be simplified and related circuit simplifications may be employed as is well known in the art.

Low voltage regulator 14 receives power and control signals 40 provided by power up logic 12. In alternate and equivalent embodiments, regulator 14 regulates elevated voltages or currents. Control signals 40 enable and govern the operation of low voltage regulator 14. Similarly control signals 46, including power up initialization signal PWRP, provided by power up logic 12 enable and govern the operation of substrate charge pumps 16, special charge pumps 18, and primary regulators 20.

The sequence of enablement of these several functional blocks depends on the circuitry of each functional block and upon the power signal sequence requirements of circuit 30. The sequence of enablement as well as the functions of control signals 46 coupled to circuit 30 are conventionally subsumed in the process of initialization.

Circuit 30 is a circuit for performing an electrical function of IC 10. In various embodiments circuit 30 is an analog circuit, a digital circuit, or a combination of analog and digital circuitry. Although the present invention is effectively applied where circuit 30 includes dynamic memory (DRAM), a static memory (SRAM), or a video memory (VRAM), the present invention can be beneficially and equivalently applied by a person of ordinary skill to integrated circuits in general, whether or not the integrated circuit is powered from a single power supply potential. Proper operation of circuit 30 follows from an initial condition, established during the process of initialization and in response to control signals 46, particularly power up initialization signal PWRP.

Power to be applied to circuit 30 is conventionally regulated to permit use of integrated circuit 10 in systems providing power that is insufficiently regulated otherwise for proper operation of circuit 30. Low voltage regulator 14 includes a voltage reference and regulator circuit having sufficient regulated output to supply signal. $V_{CCR}$, part of power signals 50. In one embodiment, control signals 46 include signals related to signal PWRP for enabling primary regulators 20 at a time when reliable initialization of circuit 30 can be assured.

Figure 2:
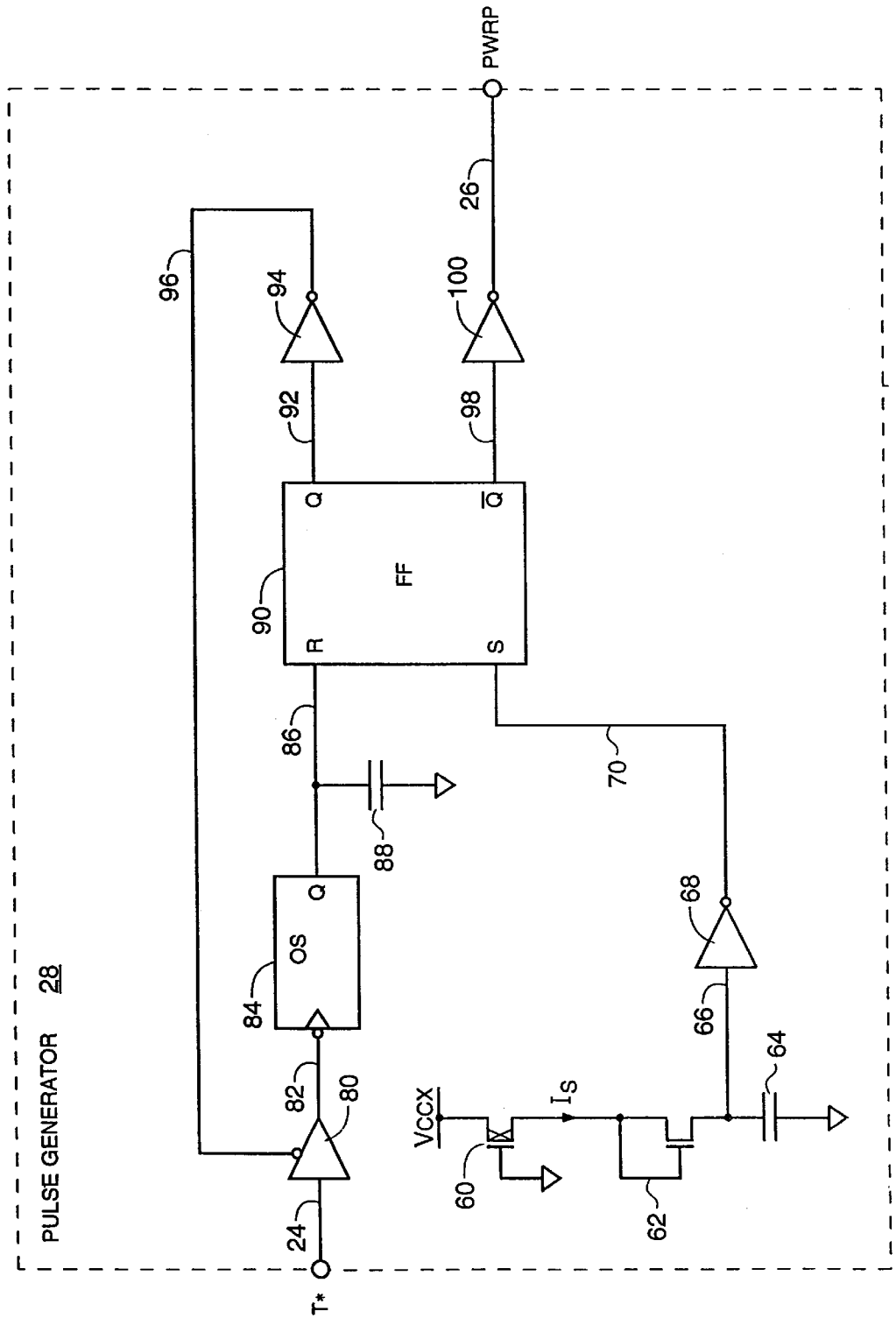
FIG. 2 is a schematic diagram of a pulse generator included in an embodiment of power up logic 12 shown in FIG. 1.

FIG. 2 is a schematic diagram of a pulse generator included in an embodiment of power up logic 12 shown in FIG. 1. Pulse generator 28 responds to input signal T* on line 24 and power signal $V_{CCX}$ to provide power up initialization pulse PWRP on line 26. Pulse generator 28 includes flip flop 90; means for establishing the initial state of flip flop 90 principally including capacitors 88, 64, and inverter 68; means for toggling flip flop 90 after a delay principally including FETs 60 and 62, capacitor 64, and inverter 68; and means for toggling flip flop 90 in response to an input signal principally including input buffer 80, and one shot 84.

When $V_{CCX}$ is applied to pulse generator 28, flip flop 90 is set. Capacitors 64 and 88 hold the voltage on lines 66 and 86 to logic low. Inverter 68 provides a logic high on line 70. With the R input low and the S input high, flip flop 90 is set. In the set state, flip flop 90 generates a low on line 98 and signal PWRP on line 26 rises to logic high by operation of inverter 100. Signal PWRP remains high until a timeout signal is generated on line 70 and a falling edge of signal T* is received on line 24.

FETs 60 and 62 and inverter 68 cooperate as a timer circuit. FETs 60 and 62 cooperate as a current source for charging capacitor 64 at a constant rate. When the voltage from line 66 to ground, also called the plate voltage of capacitor 64, exceeds the switching threshold of inverter 68, inverter 68 generates a timeout signal, logic low, on line 70. When lines 86 and 70 are both logic low, the state of flip flop 90 does not change.

When a high to low transition is received on line 24, input buffer 80 provides a buffered input signal of the same logic levels on line 82. The high to low transition triggers one shot 84 so that a high true pulse of predetermined duration is generated on line 86.

When line 86 is high and line 70 is low, flip flop 90 is reset. In the reset state, flip flop 90 generates a logic low on line 92, which is inverted by inverter 94 to disable input buffer 80. By disabling input buffer 80, one shot 84 cannot be retriggered and flip flop 90 remains in the reset state. While in the reset state, flip flop 90 generates a high on line 98. Inverter 100, consequently, generates a low on line 26 and signal PWRP falls to logic low. Since neither the timer circuit nor one shot 84 is retriggerable, line 26 conveys but two signals: a rising edge when $V_{CCX}$ is applied, and a falling edge when flip flop 90 is reset, thus forming the initialization pulse signal PWRP.

Input buffer 80 and one shot 84 cooperate as means for detecting a falling edge on line 24. One skilled in the art will readily appreciate that conventional edge detection circuits may be substituted. When the physical layout of integrated circuit 10 demands that flip flop 90 be located a substantial distance from input buffer 80, the duration of the pulse generated by one shot 84 is extended to mitigate phase distortion of the generated pulse due to transmission line effects. By using one shot 84, there is no need to maintain a high on line 86 continually after power up initialization; thus, operating power is conserved. In an alternate embodiment wherein flip flop 90 is located close to input buffer 80 or power dissipation is not critical, one shot 84 may be eliminated and input buffer 80 revised to maintain a high on lines 82 and 86 when disabled.

Figure 3:
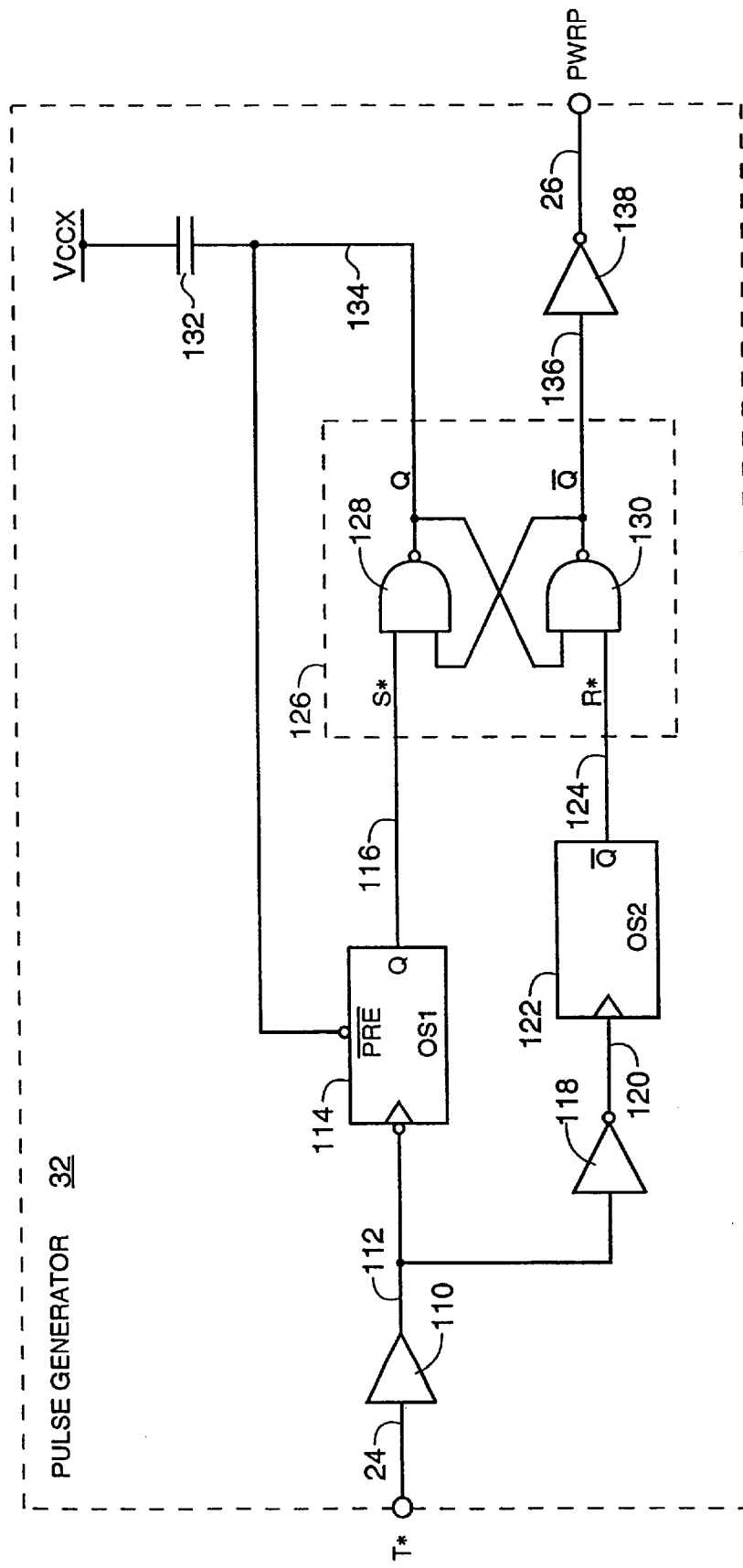
FIG. 3 is a schematic diagram of an alternate pulse generator included in an alternate embodiment of power up logic 12 shown in FIG. 1.

FIG. 3 is a schematic diagram of an alternate pulse generator included in an alternate embodiment of power up logic 12 shown in FIG. 1. Pulse generator 32 responds to input signal T* on line 24 and power signal $V_{CCX}$ to provide power up initialization pulse PWRP on line 26. Pulse generator 32 includes flip flop 126; means for establishing the initial state of flip flop 126 principally including capacitor 132 and second one shot 122; and means for toggling flip flop 126 in response to an input signal principally including input buffer 110, one shot 114, inverter 118, and one shot 122.

When $V_{CCX}$ is applied to pulse generator 32, flip flop 126 is set. Capacitor 132 has substantial capacitance so that even a relatively slow transition on $V_{CCX}$ is coupled onto line 134 as a high logic level concurrent with the application of $V_{CCX}$. Signal T*, being low true, rises with $V_{CCX}$ to its non asserted high level. Second one shot 122, prior to being triggered, provides a logic high on line 124. With a high on reset input R* and a high on line 134, flip flop 126 is set. In the set state, flip flop 126 generates a low on line 136 and signal PWRP on line 26 rises to logic high by operation of inverter 138. Signal PWRP remains high until a falling edge of signal T* is received on line 24.

When a high to low transition is received on line 24, input buffer 110 provides a buffered input signal of the same logic levels on line 112. The high to low transition triggers first one shot 114 so that a high true pulse of predetermined duration is generated on line 116. Inverter 118 inverts the high to low transition so that second one shot 122 is triggered simultaneously with first one shot 114. Second one shot 122 generates a concurrent low true pulse of predetermined duration on line 124.

When line 116 is high and line 124 is low, flip flop 126 is reset. In the reset state, flip flop 126 generates a logic low on line 134 to preset first one shot 114. When preset, one shot 114 cannot be retriggered and generates a high on line 116. With S* high, the logic level on line 124, the R* input to flip flop 126, has no effect and flip flop 126 remains in the reset state.

While in the reset state, flip flop 126 generates a high on line 136. Inverter 138, consequently, generates a low on line 26 and signal PWRP falls to logic low. Since neither one shot 114 nor 122 is retriggerable, line 26 conveys but two signals: a rising edge when $V_{CCX}$ is applied, and a falling edge when flip flop 126 is reset, thus forming the initialization pulse signal PWRP.

Input buffer 110, first one shot 114, inverter 118, and second one shot 122, cooperate as means for detecting a falling edge on line 24 so as to reset flip flop 126. One skilled in the art will readily appreciate that conventional edge detection circuits may be substituted.

When the physical layout of integrated circuit 10 demands that flip flop 126 be located a substantial distance from input buffer 110, the duration of the pulse generated by each one shot is extended to mitigate phase distortion of the generated pulse due to transmission line effects. When the distance from one shot 114 to flip flop 126 is similar to the distance from one shot 122 to flip flop 126, the duration of the pulses generated by one shots 114 and 122 are similar.

Figure 4:
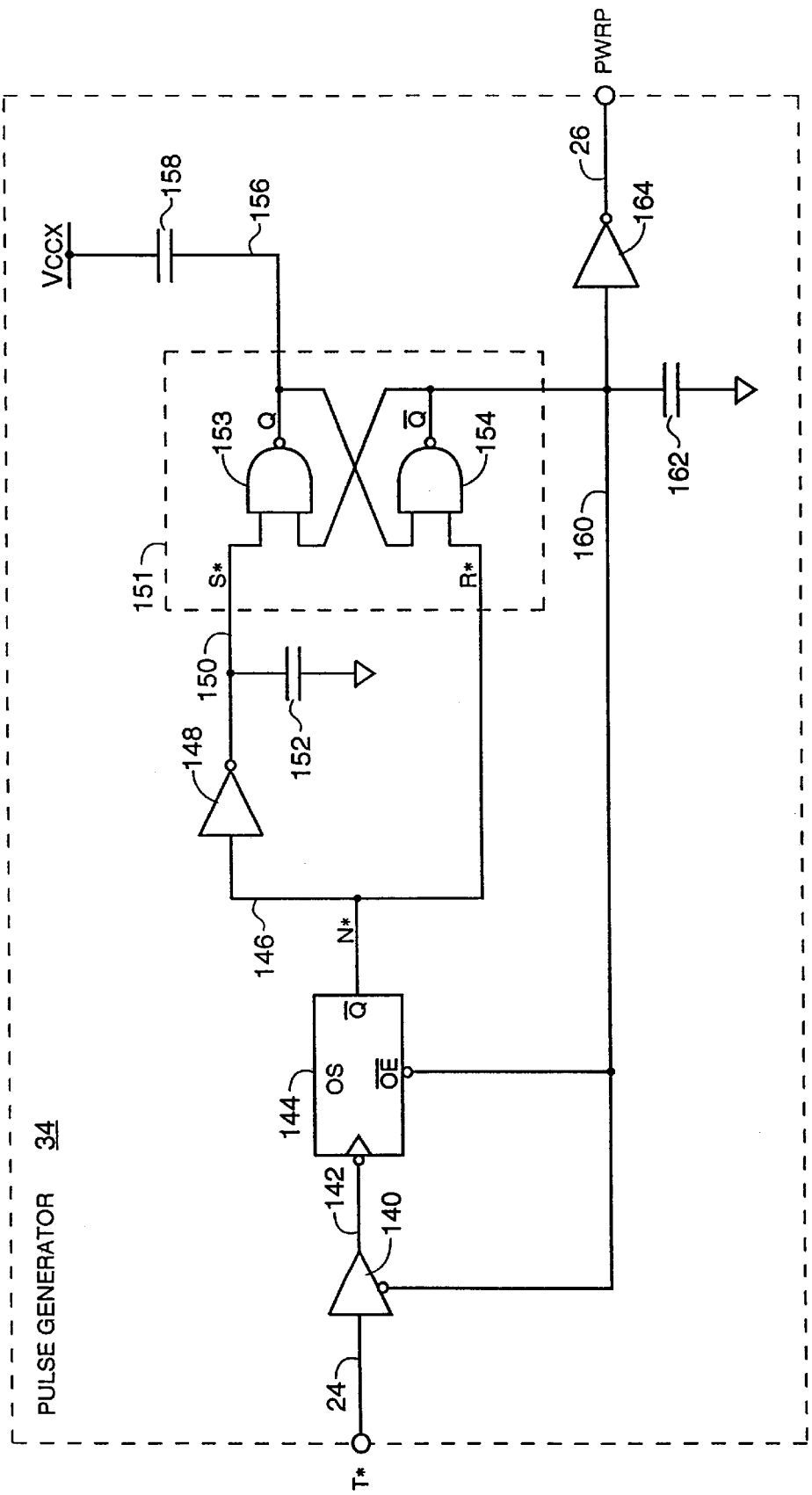
FIG. 4 is a schematic diagram of another alternate pulse generator included in another alternate embodiment of power up logic 12 shown in FIG. 1.

FIG. 4 is a schematic diagram of another alternate pulse generator included in another alternate embodiment of power up logic shown in FIG. 1. Pulse generator 34 responds to input signal T* on line 24 and power signal $V_{CCX}$ to provide power up initialization pulse PWRP on line 26. Pulse generator 34 includes flip flop 151; means for establishing the initial state of flip flop 151 principally including capacitors 152, 158, and 162; and means for toggling flip flop 151 in response to an input signal principally including input buffer 140, one shot 144, and inverter 148.

When $V_{CCX}$ is applied to pulse generator 34, flip flop 151 is set. Capacitors 152, 158, and 162 provide redundant capability, assuring flip flop 151 is set. In alternate embodiments, up to two of capacitors 152, 158, and 162 are eliminated to reduce space requirements on the IC substrate. When used, capacitors 152 and 162 hold lines 150 and 160 to logic low for a time after $V_{CCX}$ is applied. By holding either or both of these lines low, gate 153 generates a high on line 156 and flip flop 151 is set.

Capacitor 158 cooperates with one shot 144 to set flip flop 151. When used, capacitor 158 has substantial capacitance so that even a relatively slow transition on $V_{CCX}$ is coupled onto line 156 as a high logic level concurrent with the application of $V_{CCX}$. One shot 144 generates a logic high on line 146 until triggered. In response to a high on lines 146 and 156, gate 154 generates a low and flip flop 151 is set.

In the set state, flip flop 151 generates a low on line 160 and signal PWRP on line 26 rises to logic high by operation of inverter 164. Signal PWRP remains high until a falling edge of signal T* is received on line 24.

When a high to low transition is received on line 24, input buffer 140 provides a buffered input signal of the same logic levels on line 142. The high to low transition triggers one shot 144 so that a low true level for a predetermined duration is generated on line 146. Inverter 148 inverts the low level so that a high level is generated on line 150.

When line 150 is high and line 146 is low, flip flop 151 is reset. In the reset state, flip flop 151 generates a logic high on line 160 to disable input buffer 140 and one shot 144. While disabled, one shot 144 continues generating a low on line 146. With S* high and R* low flip flop 151 remains in the reset state.

Inverter 164 responds to the high on line 160 to generate a low on line 26 and signal PWRP falls to logic low. Since one shot 144 is not retriggerable, line 26 conveys but two signals: a rising edge when $V_{CCX}$ is applied, and a falling edge when flip flop 151 is reset, thus forming the initialization pulse signal PWRP.

Input buffer 140 and one shot 144 cooperate as means for detecting a falling edge on line 24 so as to reset flip flop 151. One skilled in the art will readily appreciate that conventional edge detection circuits may be substituted. Inverter 148 and gates 153 and 154 cooperate to form a T-type flip flop. One skilled in the art will readily appreciate that conventional T-type flip flop circuits may be substituted.

Figure 5:
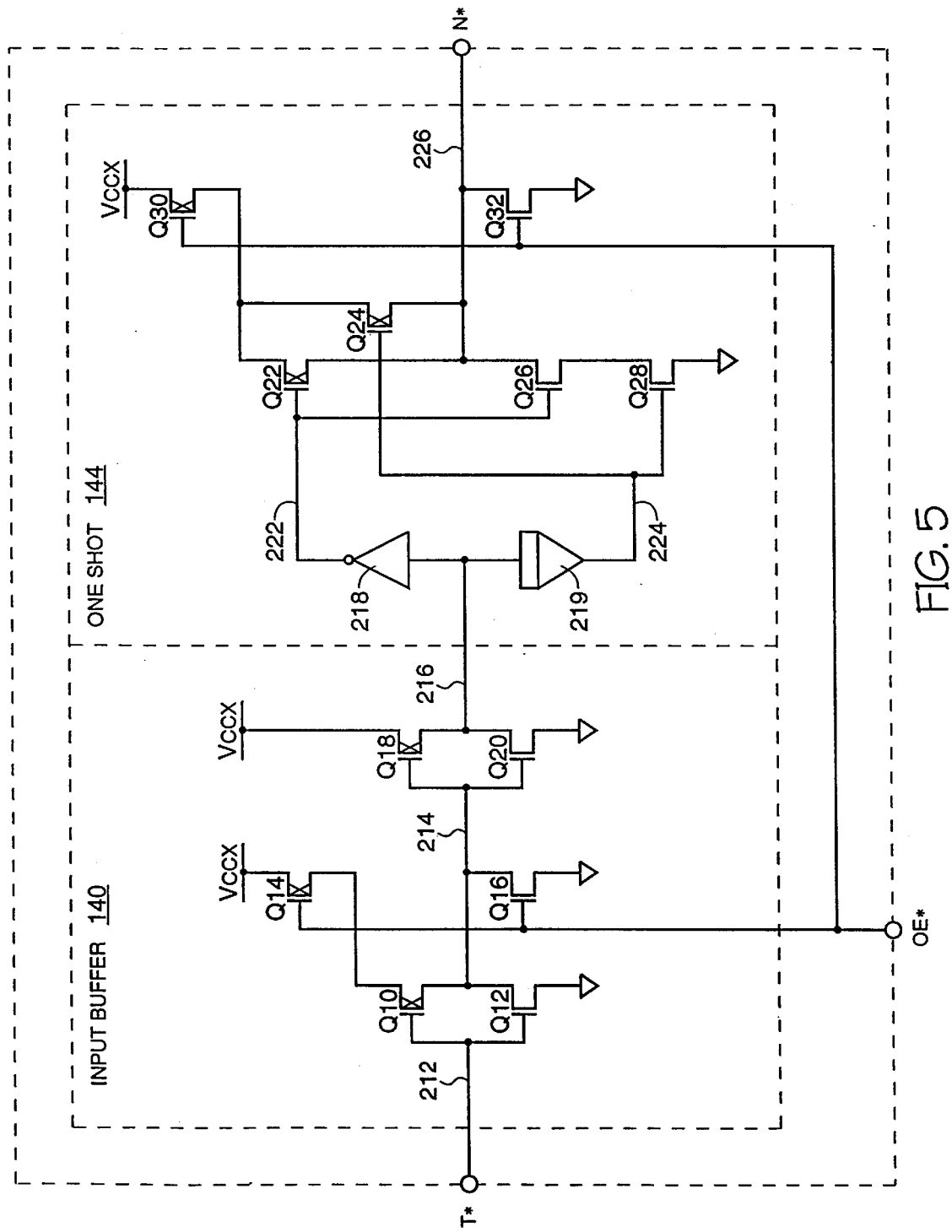
FIG. 5 is a schematic diagram of an input buffer and one shot shown in FIG. 4.
Figure 6:
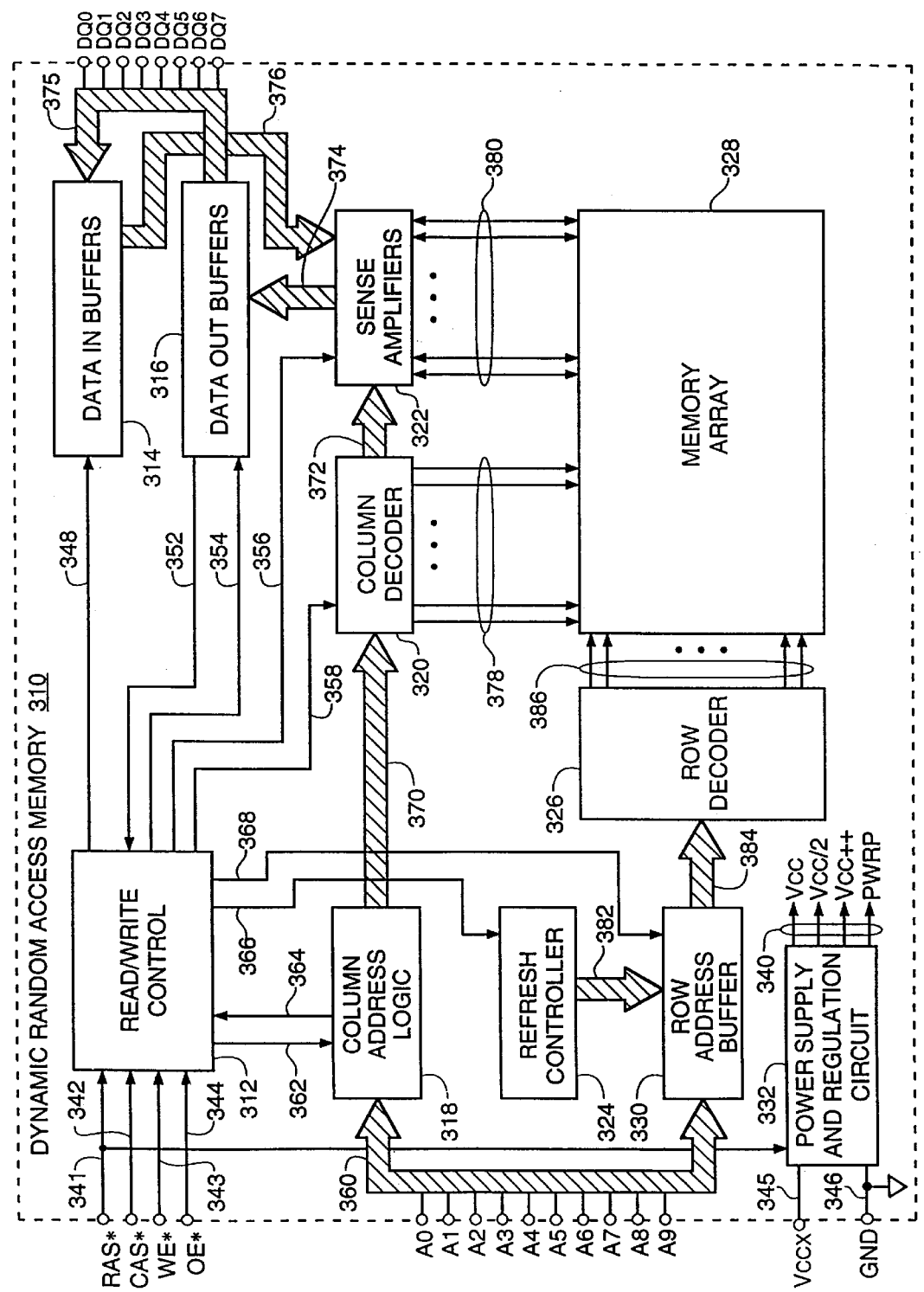
FIG. 6 is a functional block diagram of a dynamic random access memory according to an embodiment of the present invention.

FIG. 5 is a schematic diagram of an input buffer and one shot shown in FIG. 4. Input buffer 140 in the embodiment shown includes FETs Q10 through Q20. Field effect transistors (FETs) Q10 and Q12 form an inverting amplifier with high input impedance, buffering the load on line 214 from the source of signal T*. FET Q14 when turned off by disable signal OE* low interrupts current flow through FETs Q10 and Q12, conserving power. FET Q16 when turned on by disable signal OE* low, holds line 214 to logic low. FETs Q18 and Q20 cooperate as a CMOS inverter stage, providing inversion and additional drive on line 216. When other signals, such as row address strobe signals to be discussed with reference to FIG. 6, are conveyed on conductor 212, other input buffers, not shown, are used independently from input buffer 140 to support use of such other signals.

One shot 144 includes inverter 218, delay element 219, NAND gate circuitry including FETs Q22 through Q28, and disable circuitry including FETs Q30 and Q32. The output of input buffer 140, line 216, is connected to inverter 218 and delay element 219. Inverter 218 is formed from an odd number of CMOS inverter stages. In one embodiment, delay element 219 is formed from an even number of CMOS inverter stages. Alternate and equivalent embodiments employ other conventional inverter and delay element circuitry.

FETs Q22 through Q28 cooperate as a conventional two-input CMOS NAND gate. First input, line 222, responds to signal T* after inversion, hence, T. Second input, line 224, responds to a delayed signal T*. The output of NAND circuitry on line 226 is low only when both lines 222 and 224 are high. Lines 222 and 224 are both high immediately following the rising edge of signal T. Consequently, NAND circuitry generates on line 226 a low true pulse following the falling edge of signal T*. The duration of the pulse corresponds to the amount of delay in delay element 219.

Disable circuitry including FETs Q30 and Q32 operates to conserve power and to force a logic low on line 226 in a manner as already discussed with reference to FETs Q14 and Q16.

FIG. 6 is a functional block diagram of a dynamic random access memory according to an embodiment of the present invention. Memory 310 provides an output data signal Q, corresponding to data stored in the memory. Memory 310 also responds to an input data signal D corresponding to data to be stored in the memory. The D and Q signals are conveyed on bidirectional lines 375 labeled DQ.

Power supply and regulation circuit 332 responds to power supplied to memory 310 on lines 45 ($V_{CCX}$) and 46 (GND) to provide power signals to all other memory functional blocks via power and control signal lines 340. Circuit 30, shown in FIG. 1 corresponds to all functional blocks shown on FIG. 6 except block 332. All functional blocks shown on FIG. 1 except block 30 are included in power supply and regulator circuit 332. Power and control signals 340 include internal $V_{CC}$, used generally to power functional blocks of memory 310; $V_{CC/2}$ used generally for precharging circuitry that normally attains one of two binary voltage levels symmetric in magnitude about $V_{CC/2}$; $V_{CC+}$ used generally booted signals for writing data into memory array 328; and power up initialization signal PWRP. Several circuits in memory 310 are responsive to signal PWRP for establishing an initial condition from which memory read and memory write functions proceed.

Memory 310 includes an array of memory cells 328 and addressing means for identifying a selected memory cell for reading or writing and for providing the data output signal. Addressing means includes all blocks shown in FIG. 6 except power supply and regulation circuit 332, data-in buffer 314, and memory array 328, in as much as all of the remaining blocks cooperate to identify a cell and to provide the data output signal.

Memory 310 is controlled by binary control signals input on lines 341 through 344 from the device contacts to read/write control 312. Control signals on lines 341–344 are conventionally known by names corresponding to the primary function of each signal. The primary signal on line 341 is row address strobe (RAS*); on line 342 is column address strobe (CAS*); on line 343 is write enable (WE*); and on line 344 is output enable (OE*).

When RAS* falls, the state of address bus 360 is latched in row address buffer 330 in response to control signals on line 368. When CAS* falls, the state of address bus 360 is latched in column address logic 318 in response to control signals on line 362. Row address buffer 330 and column address logic 318 conventionally employ registers for maintaining output signals in the absence of input signals. When $V_{CCX}$ is applied to these circuits, register contents are unpredictable. In the case of column address logic 318, an invalid result of comparison results when the contents of the register for maintaining the prior address is erroneous. Column address logic 318 and row address buffer 330 respond to signal PWRP to assure proper address comparison and proper addressing of memory array 328.

Line 341 is coupled to power supply and regulation circuit 332 wherein an input signal transition, heretofore described as signal T*, is detected and used for generation of an initialization pulse PWRP as already described. One of the embodiments shown in FIGS. 2 through 4 is included in power supply and regulation circuit 332 for generating power up initialization pulse PWRP included in power and control signals 340.

Several read and write functions, also called modes of operation or cycles, are conducted by read/write control 312 in response to address change signals on line 364 and combinations of control signals on lines 341–344. For example, read/write control 312 responds to changes in the column address as indicated by address change signals on line 364 for improved access time as in page mode. Read/write control 312 generates control signals on lines 348–358 for at least two different write cycles. The first, early write, follows a RAS*, WE*, CAS* control signal sequence. The second, late write, follows a RAS*, CAS*, WE * control signal sequence.

When $V_{CCX}$ is applied to read/write control 312, storage elements become active with unpredictable output states. Because read/write control 312 generates control signals at several different times during a cycle, sequential circuits with storage elements are conventionally employed. To assure proper operation of memory 310, read/write control 312 responds to signal PWRP for setting storage elements to prescribed initial states. The collective state of all storage elements in read write control 312 is called an initial condition from which proper read and write cycles can be performed.

When RAS* falls while CAS* is low, read/write control 312 provides signals on line 366 to refresh controller 324 to enable self refreshing. Refresh controller 324 includes a clock circuit and means for selecting a cell to refresh. During self refresh mode, refresh controller 324 generates signals on refresh row address bus 382 (for example, as generated by the output of a refresh row address counter or register clocked by an oscillator) to select a row of cells to refresh. Row address buffer 330 provides signals on row address bus 384 to row decoder 326. Signals on binary row address bus 384, in response to control signals on line 368, represents either the address latched when RAS* falls or the refresh row address, depending on the mode of operation. During a refresh cycle, data signals on lines 380 from the selected row are amplified by sense amplifiers 322 causing cells in the row to be refreshed.

When $V_{CCX}$ is applied to refresh controller 324, storage elements, registers, and counters become active with unpredictable output states. Because refresh control 324 generates internal control signals at several different times during a refresh cycle, sequential circuits with storage elements are conventionally employed. To assure proper operation of memory 310, read/write control 312 responds to signal PWRP for discontinuing a possible incomplete refresh cycle and setting storage elements to prescribed initial states. The collective state of all storage elements in refresh control 324 is called an initial condition from which proper refresh cycles can be performed.

In addition to cell refreshing, sense amplifiers 322 respond to control signals on line 356 and column decoder signals on line 372 to perform the memory read cycle. Signals RAS*, CAS*, WE* (high), and address signals A0 through A9 cooperate to provide a control signal for a read cycle. In read operations cell content signals on lines 380 are amplified and presented to data out buffers 316 as global I/O signals on line 374. When cell contents are to be overwritten in a write operation, sense amplifiers 322 establish proper cell contents in response to write data signals on line 376 from data-in buffers 314.

Data-in buffers 314 are instrumental for write operations. Signals RAS*, CAS*, WE* (low), OE*, and address signals A0 through A9 cooperate to provide a control signal for a write cycle. In write operations cell contents are changed to correspond to the outputs on line 376 of data-in buffers 314.

Data-in buffers 314 are driven by data bus 375 which comprises several individual data lines shown as $DQ_n$. For each line, data-in buffers 314 employ latch circuitry, strobed to accept input data signals. When $V_{CCX}$ is applied to these latch circuits unpredictable contents result. Data-in buffers 314 respond to signal PWRP to clear latch circuits to conserve power and to avoid writing erroneous data into memory.

Memory 310 has eight DQ lines, each of which is bidirectional. Alternate memory devices may have less or more DQ lines and may have separate lines for the data-in (D) function and the data-out (Q) function. In memory 310, each bidirectional line is driven by a three state circuit to represent a logic low, a logic high, or an off state. In the off state, the three state circuit connects a high impedance to the DQ line so that drive circuits external to memory 310 can drive a signal onto the DQ line for data-in buffer 314.

Data-out buffers 316 employ latch circuitry, strobed to accept data signals from sense amplifiers 374. When $V_{CCX}$ is applied to these latch circuits unpredictable contents result. Data-out buffers 316 respond to signal PWRP to clear latch circuits to conserve power and to avoid reporting erroneous data from memory.

In an equivalent memory of the present invention, not shown, storage cells are arranged in a ring rather than in a row-column array as shown in FIG. 6. In such an arrangement, control and address signals different from those shown in FIG. 6 comprise the control signals for a read and a write operation. Storage ring architectures include magnetic bubble and charge coupled devices as is well known in the art.

In another equivalent memory, not shown, memory 310 additionally includes serial access means coupled to sense amplifiers 322 for providing serial access between the memory array and a serial input/output buffer circuit. In such a memory, control signals 356 include a transfer signal for enabling data transfer between array 328 and the serial access means. In such an embodiment, pointer registers identifying the next serial bit for access are cleared by signal PWRP.

The foregoing description discusses preferred embodiments of the present invention, which may be changed or modified without departing from the scope of the present invention.

For example, P-channel FETs may be replaced with N-channel FETs (and vice versa) in some applications with appropriate polarity changes in controlling signals as required. Moreover, the P-channel and N-channel FETs discussed above generally represent active devices which may be replaced with bipolar or other technology active devices.

Still further, those skilled in the art will understand that the logical elements described above may be formed using a wide variety of logical gates employing any polarity of input or output signals and that the logical values described above may be implemented using different voltage polarities. As an example, an AND element may be formed using an AND gate or a NAND gate when all input signals exhibit a positive logic convention or it may be formed using an OR gate or a NOR gate when all input signals exhibit a negative logic convention.

These and other changes and modifications are intended to be included within the scope of the present invention.

While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

The words and phrases used in the claims are intended to be broadly construed. A "system" refers generally to electrical apparatus and includes but is not limited to a packaged integrated circuit, an unpackaged integrated circuit, a combination of packaged or unpackaged integrated circuits or both, a microprocessor, a microcontroller, a memory, a register, a flip-flop, a charge-coupled device, combinations thereof, and equivalents.

Circuits used for edge detection, delay, and pulse generation are known in the art as timing circuits and signal generators. Pulse generators include circuits known in the art as one shot multivibrators, one shots, and monostables. As used in the specification and claims, the terms pulse generator, timing circuit, generating means, signal generator, one shot, and delay element are equivalent.

A "signal" refers to mechanical and/or electromagnetic energy conveying information. When elements are "coupled", a signal can be conveyed in any manner feasible in light of the nature of the coupling. For example, if several electrical conductors couple two elements, then the relevant signal comprises the energy on one, some, or all conductors at a given time or time period. When a second circuit element is responsive to a signal arising in a first circuit element, the two are coupled, regardless of the complexity of intervening circuitry or intrinsic elements. When a physical property of a signal has a quantitative measure and the property is used by design to control or communicate information, then the signal is said to be characterized by having a "value." The amplitude may be instantaneous or an average. For a binary (digital) signal, the two characteristic values are called logic levels, "high" and "low."

An initial condition is established by reset, clear, preset, load, and equivalent logic functions as well as discharge, charge, lock, unlock, and equivalent analog and filtering functions. To initialize a circuit, a condition is established from which ensuing operations produce predictable results.

The state of a bistable circuit such as a flip flop means one of the stable combinations of its output signals, or of its observable internal signals. The states of a flip flop are conventionally called set and reset, regardless of logic polarity.

What is claimed is:

1. A memory for providing a data signal, the memory powered by a power signal and responsive to an address signal, an address strobe, and a first signal, the memory comprising:

a. a conductor for conveying the address strobe and the first signal;

b. a timing circuit, coupled to the conductor and powered by the power signal, the timing circuit for generating a second signal in response to the power signal, and for generating a third signal in response to the first signal;

c. an array of memory cells; and d. addressing means, powered by the power signal and operable from an initial condition in response to the third signal, the addressing means operable for identifying a selected memory cell of the array in response to the address signal when the address strobe is received, and for providing the data signal responsive to data stored in the selected memory cell.

2. The memory of claim 1 wherein the timing circuit comprises a flip flop for generating the third signal.

3. The memory of claim 2 wherein the timing circuit further comprises a pulse generator, responsive to the first signal, the pulse generator coupled to the flip flop for enabling generation of the third signal.

4. The memory of claim 1 wherein the timing circuit comprises:

a. an input buffer for receiving the first signal and for providing a buffered first signal when enabled, the input buffer enabled while the second signal is being generated;

b. a pulse generator, coupled to the input buffer for generating a pulse in response to the buffered first signal;

c. a delay circuit powered by the power signal for generating a timeout signal after lapse of a delay; and d. a flip flop powered by the power signal, the flip flop coupled to the pulse generator and to the delay circuit, the flip flop for generating the second signal until the timeout signal is generated and for generating the third signal after receipt of the pulse.

5. The memory of claim 1 wherein the timing circuit comprises:

a. a first pulse generator for generating, when enabled, a first pulse in response to the first signal, the first pulse generator enabled while the second signal is being generated;

b. a second pulse generator for generating a second pulse in response to the first signal; and c. a flip flop powered by the power signal and coupled to the first and second pulse generators, the flip flop for generating the second signal until the first and second pulses are received.

6. The memory of claim 1 wherein the timing circuit comprises:

a. an input buffer for receiving the first signal and for providing a buffered first signal when enabled, the input buffer enabled while the second signal is being generated; and b. a flip flop powered by the power signal, the flip flop being coupled to the input buffer, the flip flop generating the second signal after receiving the power signal and generating the third signal after receipt of a pulse.

7. The memory of claim 6 wherein the first signal is a transition between logic levels.

8. The memory of claim 6 further comprising means for holding the flip flop in a first state until after the lapse of a delay from receipt of the power signal.

9. The memory of claim 1 wherein:

a. the memory is responsive to an input data signal; and b. the addressing means comprises an input data buffer for receiving the input data signal.

10. The memory of claim 9 wherein the input data buffer is coupled to the timing circuit so that data having been received before generation of the third signal is ignored after the third signal is generated.

11. The memory of claim 1 wherein the addressing means comprises an output buffer coupled to the timing circuit, the output buffer responsive to the third signal so that data for output prior to the generation of the third signal is not output after the third signal is generated.

12. The memory of claim 1 wherein the addressing means comprises address comparison logic coupled to the timing circuit.

13. The memory of claim 1 wherein the addressing means comprises read control logic.

14. The memory of claim 13 wherein the read control logic is operable in multiple modes including a predetermined mode of operation, and regardless of the mode of operation before generation of the third signal, the read control logic is operable from the predetermined mode of operation after the third signal is generated.

15. The memory of claim 1 wherein the memory comprises dynamic memory cells and the addressing means comprises a refresh controller for maintaining data in the dynamic memory cells.

16. The memory of claim 15 wherein the refresh controller is operable in multiple modes including a predetermined mode of operation, and regardless of the mode of operation before generation of the third signal, the refresh controller is operable from the predetermined mode of operation after the third signal is generated.

17. An integrated circuit for performing an electrical function beginning from an initial condition, the integrated circuit responsive to a power signal and an input signal received a first time after the power signal is generated, the integrated circuit comprising:

a. a subcircuit for performing the electrical function in response to the input signal, the subcircuit responsive to an initialization signal for establishing the initial condition;

b. a flip flop, coupled to the subcircuit, for generating the initialization signal, the flip flop settable to a state of a group of states consisting of a first state and a second state;

c. means for setting the flip flop to the first state in response to the power signal so that the flip flop generates the initialization signal; and d. means for terminating the generation of the initialization signal by toggling the flip flop in response to the input signal.

18. The integrated circuit of claim 17 further comprising means for holding the flip flop in first state until after the lapse of a delay from receipt of the power signal.

19. The integrated circuit of claim 17 wherein the input signal is a transition between logic levels.

* * * * *